(12) United States Patent
Samson et al.

(10) Patent No.: US 7,613,941 B2
(45) Date of Patent: Nov. 3, 2009

(54) MECHANISM FOR SELF REFRESH DURING ADVANCED CONFIGURATION AND POWER INTERFACE (ACPI) STANDARD C0 POWER STATE

(75) Inventors: Eric C. Samson, Folsom, CA (US); Robert Riesenman, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 389 days.

(21) Appl. No.: 11/323,344

(22) Filed: Dec. 29, 2005

(65) Prior Publication Data

US 2007/0157046 A1     Jul. 5, 2007

(51) Int. Cl.
 *G06F 1/00* (2006.01)
 *G06F 1/26* (2006.01)
 *G06F 12/00* (2006.01)

(52) U.S. Cl. .................. 713/323; 713/300; 713/320; 711/106

(58) Field of Classification Search ................ 713/323, 713/300, 320; 711/106
See application file for complete search history.

(56) References Cited

U.S. PATENT DOCUMENTS

| | | | | |
|---|---|---|---|---|
| 5,564,015 A | * | 10/1996 | Bunnell | 714/47 |
| 5,966,725 A | * | 10/1999 | Tabo | 711/106 |
| 6,275,895 B1 | | 8/2001 | Tabo | 711/106 |
| 6,693,641 B1 | | 2/2004 | Mehta et al. | 345/558 |
| 6,816,977 B2 | * | 11/2004 | Brakmo et al. | 713/323 |
| 2003/0210247 A1 | | 11/2003 | Cui et al. | 345/534 |
| 2004/0139359 A1 | | 7/2004 | Samson et al. | 713/320 |

* cited by examiner

*Primary Examiner*—Mark Connolly
*Assistant Examiner*—Stefan Stoynov
(74) *Attorney, Agent, or Firm*—Blakely, Sokoloff, Taylor & Zafman LLP

(57) ABSTRACT

An embodiment may be an apparatus comprising a link coupled with a memory, and circuitry coupled with the link to calculate the amount of memory access idle time, determine if memory access idle time is sufficient to change to a self-refresh state, and change to a self-refresh state based on memory access idle time without explicit notification from a processor regarding the processor power state. Another embodiment may be a method for memory to enter self-refresh comprising calculating the amount of memory access idle time, determining if memory access idle time is sufficient to change to a self-refresh state, and changing to a self-refresh state based on memory access idle time without explicit notification from a processor regarding the processor power state. Various other embodiments systems, methods, machine readable mediums and apparatuses may provide similar functionality to these exemplary embodiments.

18 Claims, 4 Drawing Sheets

MECHANISM FOR SELF REFRESH DURING ADVANCED CONFIGURATION AND POWER INTERFACE (ACPI) STANDARD C0 POWER STATE

BACKGROUND

The Advanced Configuration and Power Interface Standard, Revision 3.0, published Sep. 2, 2004 ("ACPI"), provides an interface for operating system control of hardware components, allowing flexible power management. The ACPI provides a method to conserve energy by transitioning unused devices into lower power states and may even place an entire system in a low-power sleeping state when desirable. A computer system in accordance with the ACPI standard may reduce power to less active components such as display screens or hard drives or may even turn available devices on or off. The ACPI standard therefore defines interface mechanisms that allow an ACPI-compatible operating system to control and communicate with an ACPI-compatible hardware platform.

According to the ACPI standard, processor power states (Cx states) are processor power consumption and thermal management states and may be further defined within a global working state, G0. Cx states include C0, C1, C2, C3 and up to Cn. Furthermore, Cx states possess specific entry and exit semantics as are briefly defined in the paragraphs below.

According to the ACPI standard, a processor may execute instructions while it is in the C0 processor power state. In the C1 power state, hardware latency is low enough that operating software does not consider the latency aspect of the state when deciding whether to use it. As defined in the standard, this state has no other software-visible effects aside from putting the processor in a non-executing power state.

The C2 power state offers improved power savings over the C1 state. The worst-case hardware latency for this state is provided by ACPI system firmware and operating software can use this information to determine when the C1 state should be used instead of the C2 state. Also as defined by the standard, the C2 state has no other software-visible effects other than putting a processor in a non-executing power state.

The C3 power state offers improved power savings over the C1 and C2 states. The worst-case hardware latency for this state is provided by ACPI system firmware and operating software can use this information to determine between states. While in the C3 state, a processor's caches maintain state but ignore any snoops, and operating software is responsible for ensuring that the caches maintain coherency. For a more detailed definition of each Cx state, see section 8.1 of the ACPI standard, Processor Power States.

A Dynamic Random Access Memory (DRAM) is a typical memory to store information. DRAMs consist of a memory cell array/matrix, where each memory cell may be coupled to one of a plurality of sense amplifiers, bit lines, and word lines. The memory cell matrix may further be subdivided into a number of banks.

DRAM memory cells consist of a single transistor and capacitor. Charge stored in a DRAM memory cell decays due to leakage current and information is eventually lost unless the charge is periodically refreshed. Since the charge must be refreshed periodically, this memory is called dynamic. An example refresh operation includes a memory controller reading data from a cell array and rewriting the data in the cell array, refreshing a capacitor in the memory cell to a previous charge. Synchronous DRAM (SDRAM) currently supports self-refresh. Self-refresh is a refresh operation executed by memory rather than a memory controller. During self-refresh a memory may use an internal oscillator to generate refresh cycles to maintain data stored in the memory cells.

Memory in self-refresh consumes less power, but there is an associated exit latency to resume normal operation. Since performance is dependant on memory access time, it can be increased when a memory controller is aware how much time it has to wake up memory and be ready when a processor needs it.

A conventional power saving approach is Rapid Memory Power Management (RMPM). RMPM is a feature in a memory controller that saves platform power by checking processor utilization. If a processor coupled with the memory controller is in C2-C4 ACPI states, it may not access memory, allowing memory to enter self-refresh. A memory controller may also turn off logic related to reading/writing memory to save power. Power can be saved due to the degree of clock gating and Delay-Locked Loop (DLL) shutdown on a controller during this state.

DRAM Row Power Management (DRPM) is another method to reduce power requirements. In DRPM, a memory row may be powered down during normal operation based on idle conditions in that row of memory. If pages for a row have all been closed at the time of power down, then a device may enter an active power down state. If pages remain open at the time of power down, the device can enter a pre-charge power down state.

Typically, memory only enters self-refresh when notified by a processor explicitly that the processor is going to be inactive, such as in ACPI states C1, C2, and C3. During C0, a processor does not explicitly state that it is going to be inactive. What is needed is a method and apparatus to enter self-refresh when not explicitly notified that coupled components not fully active.

BRIEF DESCRIPTION OF THE DRAWINGS

Embodiments of the invention may be best understood by reading the disclosure with reference to the drawings, wherein.

DETAILED DESCRIPTION

In the following description, numerous specific details are set forth. However, it is understood that embodiments of the inventions may be practiced without these specific details. In other instances, well-known circuits, structures, and techniques have not been shown in detail in order to not obscure the understanding of this description.

Reference in the specification to "one embodiment" or "an embodiment", etc., means that a particular feature, structure, or characteristic described in connection with the embodiment is included in at least one aspect of the invention. The appearances of the phrase "in one embodiment" in various places in the specification do not necessarily all refer to the same embodiment.

Various methods and apparatus are disclosed for controlling power consumption of computer systems. In an example embodiment, when a processor of a computer system is in a regular power mode, power consumption may be reduced for one or more components of a memory coupled to the processor and for other system components that have controllers associated with making requests to the memory. Embodiments may accomplish this by calculating hardware states and therefore may enter lower power states without being told explicitly by an operating system (OS) or a processor.

Figure 1:
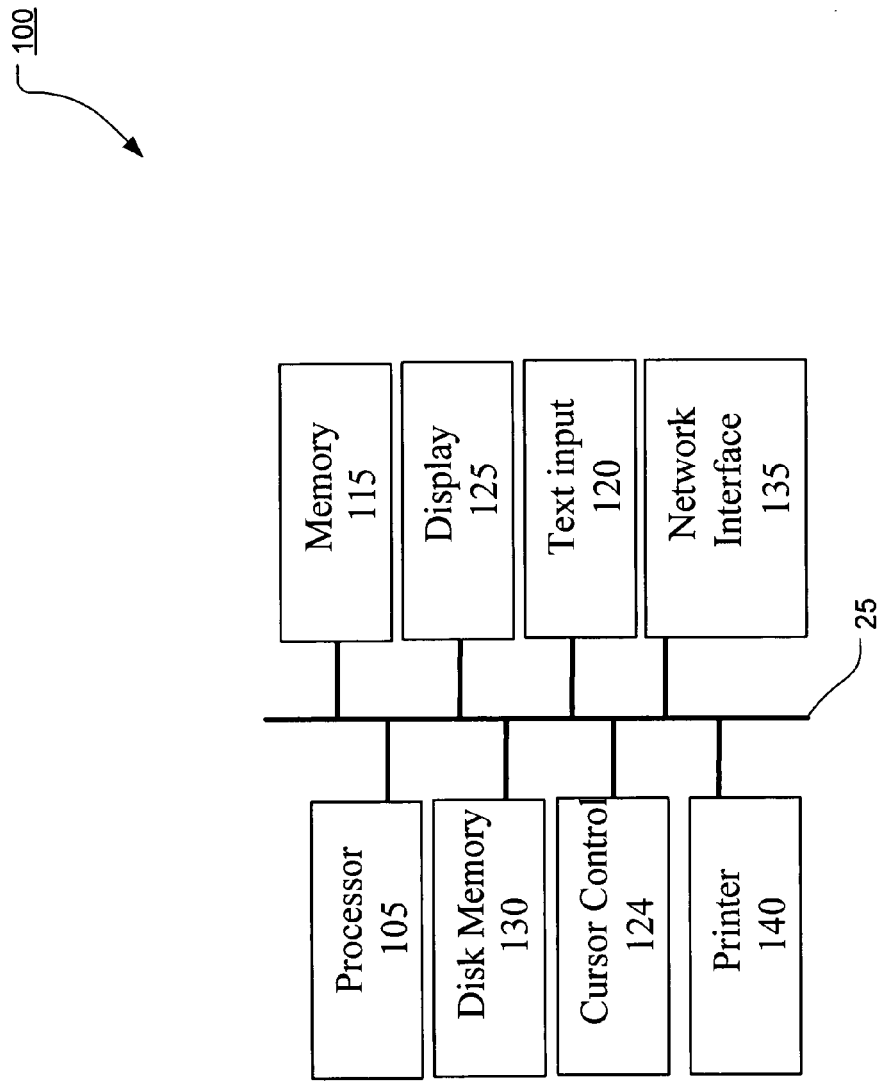
FIG. 1 is a block diagram illustrating an example of a computer system.

FIG. 1 is a block diagram illustrating an example of a computer system. The computer system 100 may include a processor, central processing unit (CPU), etc. 105 that a system memory 115 may be coupled to by bus 25. The computer system 100 may further include a display unit 125 such as a liquid crystal display (LCD), plasma screen, cathode ray tube (CRT), projection screen, etc. Information including graphics, text, imagines, etc., displayed on the display unit 125 may be controlled by a graphics controller, such as a chipset (not shown). The computer system 100 may include an alphanumeric input device 120, a cursor control device 124 and a disk memory 130.

The disk memory 130 may include a machine-readable medium (not shown) on which is stored a set of instructions (e.g., software application) embodying some of the embodiments described herein. The instructions may also reside, completely or at least partially, within the main memory 115 and/or within the processor 105. The instructions may also be transmitted or received from a network interface device 135 to connect to one or more networks. The computer system 100 may be powered by an alternating current (AC) power source or by a direct current (DC) power source using one or more batteries. Additionally, the system 100 may be a server and may comprise multiple memory 115 blocks, multiple processors 105, any subset of the blocks in FIG. 1 or may even comprise additional components.

Although not shown, the bus 25 may include one or more of address bus, bus control signals and data bus and/or even a memory controller that arbitrates between all memory access requests. The processor 105 may control the bus 25, therefore communications between input/output (I/O) devices may require processor 105 involvement.

Additionally (not shown), there may be other controllers in computer system 100 capable of taking turns with the processor 105 at making access requests to the memory 115. This may allow a controller to drive the address bus and the control signals of the bus 25 with minimal intervention by the processor 105. As an example, processor 105 may be busy performing other tasks that do not require the bus 25, or the processor 105 may be idle in a low power state. A controller may contain its own processor or microcontroller or engine that generates requests to the memory 115. Example controllers include an Ethernet controller, a universal serial bus (USB) controller, a sound transducer controller, a graphics controller, etc.

For purposes of explanation, this description provides an example integrated graphics controller as an example of a controller that is capable of detecting opportunities to place memory in a self-refresh state by monitoring states in hardware and without explicit instructions from an OS or an attached processor or processors.

Additionally, examples will be illustrated of placing memory in self-refresh without being explicitly told by a processor regarding the processor's power state. In addition to the power savings in memory, memory controllers may save power based on the same mechanisms and methods. One skilled in the art will recognize that the description may also be applicable to other controllers.

Additionally, as technologies change the controllers may be embedded in processors or even in memories, that is, the functionality may move around in hardware but embodiments may not be so limited and may apply to the functionality distributed in various hardware configurations.

Figure 2:
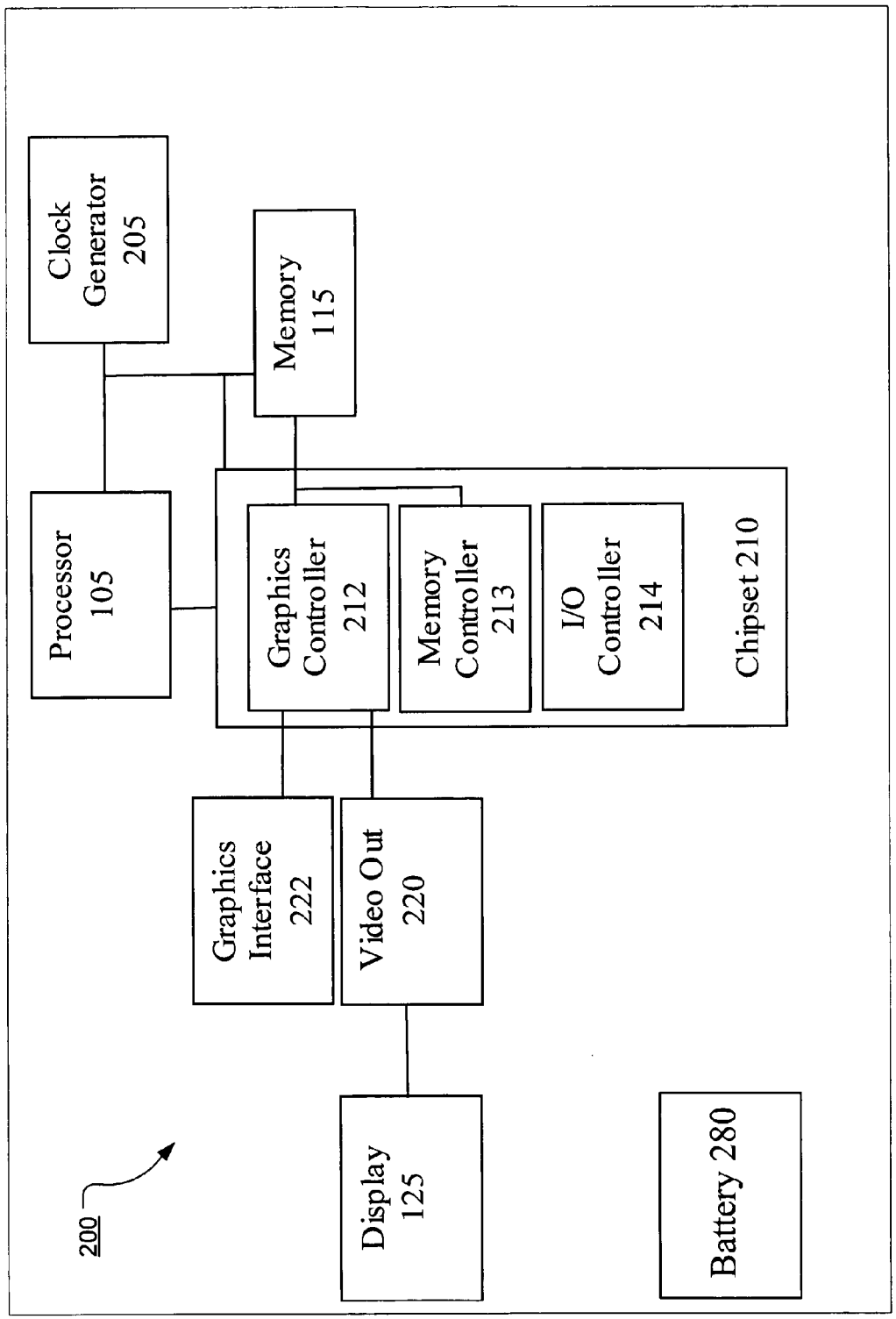
FIG. 2 is a block diagram illustrating an example of a chipset in a computer system, according to one embodiment.

FIG. 2 is a block diagram illustrating an example of a chipset in a computer system 200 according to an embodiment. The computer system 200 may include a processor 105 and a chipset 210. The chipset 210 sometimes referred to herein with the more general descriptor circuitry 210. The computer system 200 may also include a memory 115. In an embodiment, the chipset 210 may be an integrated graphics chipset such as an Intel 845G integrated graphics chipset from Intel Corporation of Santa Clara, Calif.

Furthermore, the chipset 210 may include an integrated graphics controller 212 to provide graphics/video support. The chipset 210 may also include a graphics interface 222, such as an Accelerated Graphics Port (AGP) interface, to support external graphics controllers (not shown) for advanced graphics capability. An external graphics controller may comprise memory.

The chipset 210 may also include a memory controller 213 that interfaces with the memory 115 to satisfy read/write requests from the processor 105. The memory 115 may be, for example, dynamic random access memory (DRAM), synchronous dynamic random access memory (SDRAM), double data rate (DDR) SDRAM, DDR2 SDRAM, etc.

The chipset 210 may also include an I/O controller 214 to interface with peripheral devices (not shown). Although FIG. 2 illustrates the processor 105 as a different module from the graphics controller 212, one or more of the processor 105, the graphics controller 212, and the I/O controller 214 may be implemented in one module or in multiple modules. As stated above, for example, functionalities of the memory controller 213 may be integrated in the processor 105.

The graphics controller 212 and the memory 115 may receive reference clock signals from a clock generator 205. The graphics controller 212, the memory controller 213 and the memory 115 may also include delayed locked loop (DLL) circuit(s) (not shown) used, for example, to control timings, etc.

The graphics controller 212 may perform computations to get display data from the memory 115 and to output the display data to the display unit 125 with the video out port 220. The graphics controller 212 may also control other operational behaviors of the display unit 125 including, for example, refresh rates, backlight brightness and the like. The activities performed by the graphics controller 212 may contribute to the power consumed by the chipset 210 and by the system 200.

In an embodiment, an apparatus may comprising a link coupled with a memory 115, and circuitry 210 coupled with the link, the circuitry to calculate an amount of memory 115 access idle time, determine if memory access idle time is sufficient to change to a self-refresh state, and change to a self-refresh state based on memory 115 access idle time without explicit notification from a processor 105 regarding the processor power state.

In some embodiments the memory 115 access idle time is a duty cycle threshold during an evaluation interval. In another embodiment the memory access idle time is a minimum duration in a specific power state. The present embodiment may further comprise a control bit to optionally promote within a same idleness period. In yet another embodiment the circuitry 213 may further demote to a higher power state if the memory 115 access idle time is less than a threshold.

In some embodiments, access idle time may be measured in a sliding window. For example, access idle time can be determined not just for a static time interval, but also back a certain amount of time from any query, wherein this sliding window would provide a more dynamic approach to determining when memory can go into self-refresh. Some embodiments may implement a sliding window evaluation period using a finite impulse response (FIR) filter. Another example embodiment may use an infinite impulse response (IIR) filter, for example to weight more recent information higher than older information in the sliding window.

In another embodiment, a system may comprise an integrated battery 280 power source to power circuitry 210, a memory 115 coupled with a link, and circuitry 210 coupled with the link, the circuitry 210 to calculate an amount of memory 115 access idle time, determine if memory 115 access idle time is sufficient to change to a self-refresh state, and change to a self-refresh state based on memory access idle time without explicit notification from a processor 105 regarding the processor power state.

In some system embodiments the memory 115 access idle time is a duty cycle threshold during an evaluation interval. In some system embodiments the memory 115 access idle time is a minimum duration in a specific power state. In some embodiments, the circuitry 210 may further comprise a control bit to optionally promote within a same idleness period. In yet another embodiment the circuitry may further be configured to demote to a higher power state if the memory 115 access idle time is less than a threshold.

Figure 3:
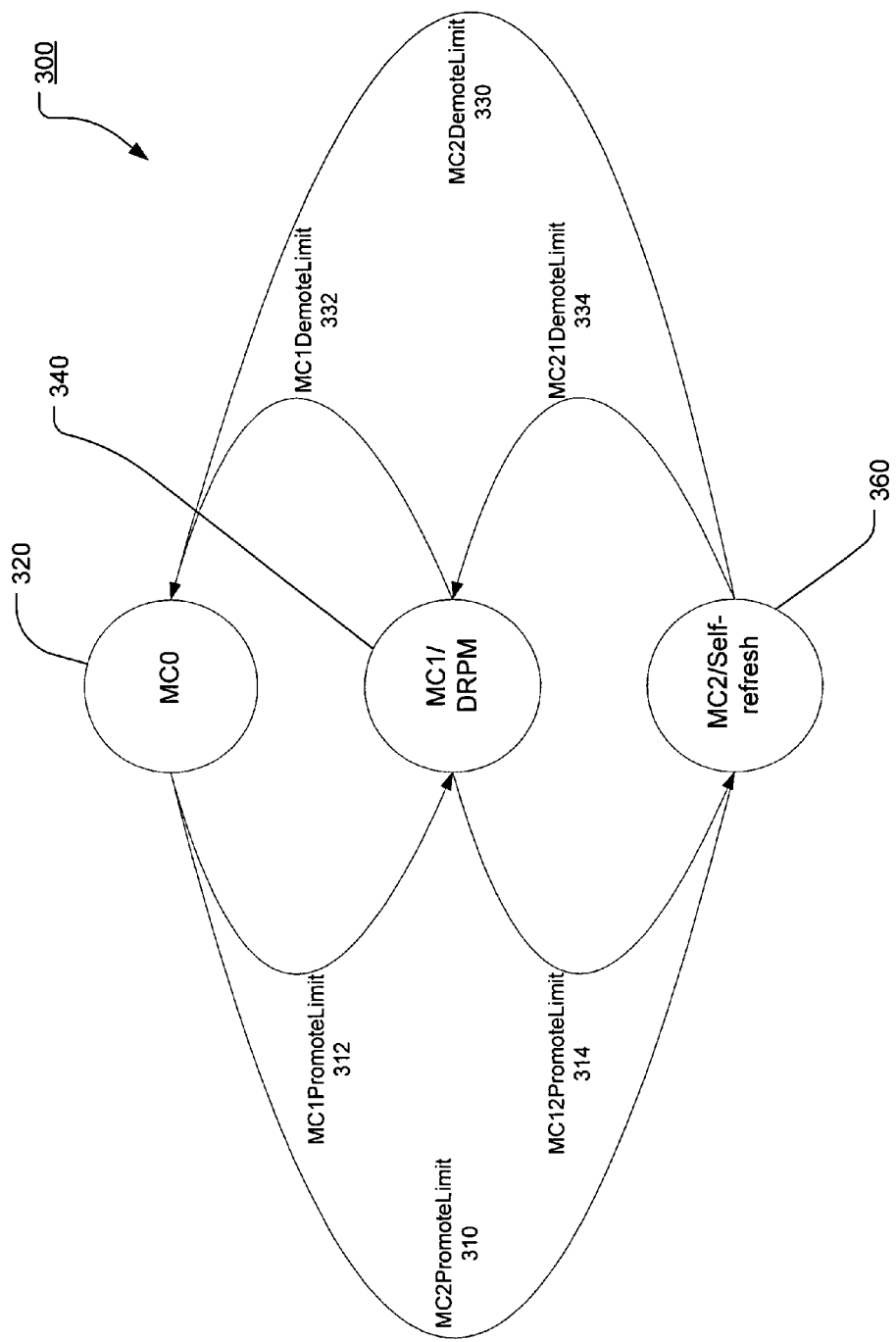
FIG. 3 is a state diagram illustrating an example embodiment for reducing power consumption of memory or a graphics controller.

FIG. 3 is a state diagram illustrating an example embodiment for reducing power consumption of memory or a graphics controller. These states may be switched in a memory controller without being explicitly instructed by an OS and also while an attached processor is in the C0 state according to the ACPI standard. In some embodiments, power can be saved due to the degree of shutdown for i/o buffers, clock trunks, clock dividers, DLLs and/or phase locked loops (PLLs) while the processor is in the C0 state or without the processor explicitly stating to controllers or memory that it will be inactive.

In some example embodiments below, hardware may be monitored and an embodiment controller of memory may place the memory into a self-refresh state based on certain hardware behavior. For example, if a processor does not access a memory for a certain idle period, or if a processors tries to access a memory within a certain period, the memory may be moved to or from a self-refresh power saving state. Additionally, if a certain threshold is reached in terms of idle or active time across an evaluation interval, the same state changes may be triggered, thus saving power in memory as well as in any controller of memory.

Some embodiments may also adjust memory accesses in order to create opportunities to enter self-refresh in memory. For example, in an embodiment memory system that supports a display 125, display refresh accesses may be made in longer bursts to improve the window of opportunity for self-refresh during C0. Furthermore, the ability to manage opportunities to enter self-refresh may be coordinated between different memory accesses.

For example, since a processor 105 may have different memory 115 access requirements than a display 125 under refresh, these separate access requirements may be coordinated in a way to allow opportunities to enter self-refresh. Therefore, a display 125 may use longer bursts for display refresh accesses based on a processor 105 having certain memory access activity, such as a certain memory access idle time, or other memory access activities that provide opportunities to coordinate self-refresh memory states.

Referring to the example embodiment in FIG. 3, a state diagram including different memory controller power states (MCx) is shown comprising state MC0 320, state MC1 340, and state MC2 360. According to this embodiment, MC0 may be defined as a normal memory state, MC1 may be defined as a DRPM state, and MC2 may be defined as a self-refresh state. FIG. 3 therefore illustrates the switching between any two states MC0 320, MC1/DRPM 340, and MC2/Self-refresh 360 as well as switching between states in either direction, towards self-refresh or towards a full power state. Additionally, all of these states may be operative while an attached processor(s) is in the ACPI C0 state.

Therefore, assuming a memory controller is operating under the MC0 320 state, it may promote to the MC1/DRPM 340 state by reaching an MC1 Promote Limit 312 or it may promote to a MC2/Self-refresh 360 state by reaching an MC2 Promote limit 310. Additionally, if the memory controller was in the MC1/DRPM 340 state, it may promote to the MC2/Self-refresh 360 state by reaching an MC12 Promote Limit 314 as illustrated in FIG. 3.

FIG. 3 also illustrates an example of demoting power states. That is, if a memory controller is in an MC2/Self-refresh 360 state, it may demote to either a MC1/DRPM 340 state or the MC0 320 state, as shown with similar demotions as the promotions on the left side of FIG. 3. In this manner, allowable exit latency of an attached processor may be used to dictate when a memory controller and/or memory may transition to or from self-refresh and thus lower the average power state.

Therefore, during C0 embodiments may promote/demote from DRAM Row Power Management (DRPM) to/from self-refresh based on DRAM access, may enter self-refresh state either immediately or at next opportunity if time in DRPM state was of sufficient duration, may enter DRPM state at next opportunity if self-refresh time was not of sufficient duration, and may take iterative frequency steps until a targeted controller utilization is hit. Some embodiments may guarantee a minimum duration may for both DRPM and self-refresh. Additionally, embodiments may optionally disable DLLs in order to save even more power. Example embodiments will now be explained in further detail with reference to the state diagram of FIG. 3.

According to one embodiment, idle time may be accumulated across an evaluation interval and decisions made regarding memory power level state based on these idle time accumulations across the interval. The example that follows refers to computing percentages, but embodiments are not so limited and in fact may utilize any suitable threshold. The following description uses pseudo-code representations, but in essence the description discloses a way to accumulate idle time across an evaluation interval to use as claimed below.

In the present example, an Idle_percentage may be defined as the (Sum of IdleTimes)/(Sampling Interval)*100%. Idle_percentage may then be used to determine if the embodiment should promote or demote to a new MCx state. Therefore, limits may be set at programmable durations such as MCxPromoteLimit=100 ms, and MCxDemoteLimit=100 ms, as examples. These two limits illustrate that for any MC state, programmable limits may be set that when they are either reached or exceeded, a controller or attached memory may be either promoted or demoted to a lower or higher power state.

The present embodiment may additionally provide that idle percentages may vary depending on if a controller or memory is operating with AC or DC power. For example:

Under AC Power, example limits may be:
 MC0PromotePercent=50%
 MC2DemotePercent=40%
 MC2PromotePercent=60%

While under DC Power, example limits may be:
 MC1PromotePercent=20% If idle 20% of time, go into MC1 when idle
 MC2DemotePercent=20% If was in MC2, but now idle 20% of time, go into MC1
 MC2PromotePercent=40% If idle 40% of time, go into MC2 when idle Therefore, according to the present embodiment if a controller is not idle for a sufficient threshold, for example if idle <8 clocks, it may stay in MC0. But if it is idle for that threshold, then idle time may be accumulated across an evaluation interval and a determination can be made to shift power saving states in memory and accompanying memory controller.

For example, the MC2PromotePercent may equate to the MC2 Promote Limit 312 in FIG. 3, and once the 40% limit is reached, the controller and memory can go into the MC2/Self-refresh 360 state when idle. It will be clear with reference to FIG. 3 how the other promote/demote percentages in the example pseudo code apply to the state diagram in FIG. 3.

According to another embodiment, idle time may be calculated simply based on a duration that memory is not being accessed. This example embodiment may ensure a minimum time in an MC state before switching to another state, for example, idle time may be calculated each time a controller enters an MCx state. Therefore, pseudo code for this embodiment may be:

---
Promote to MCx+1 when previous graphics idle time is larger than MCx_Time_Promote
Demote to MCx−1 when previous graphics idle time duration is less than MCx_Time_Demote
Therefore if:
 MC1_Time_Promote = 100 μsec  If last time spent in idle was >100 μsec, then go to MC1
 MC1_Time_Demote = 40 μsec  If last time spent in MC4 was < 20 μsec then go to MC0
 MC2_Time_Promote = 200 μsec  If last time spent in MC4 was >200 μsec, then go to MC2
 MC1_Time_Demote = 200 μsec  If last time spent in MC5 was < 200 μsec, then go to MC1
---

Additionally, a control bit may be used to optionally allow promotion within the same idleness period. A symbolic state machine for the present embodiment is very similar to the idle time accumulation across an evaluation interval embodiment, except that MCx_Time_y thresholds are used rather than MCx_y_Limits.

Figure 4:
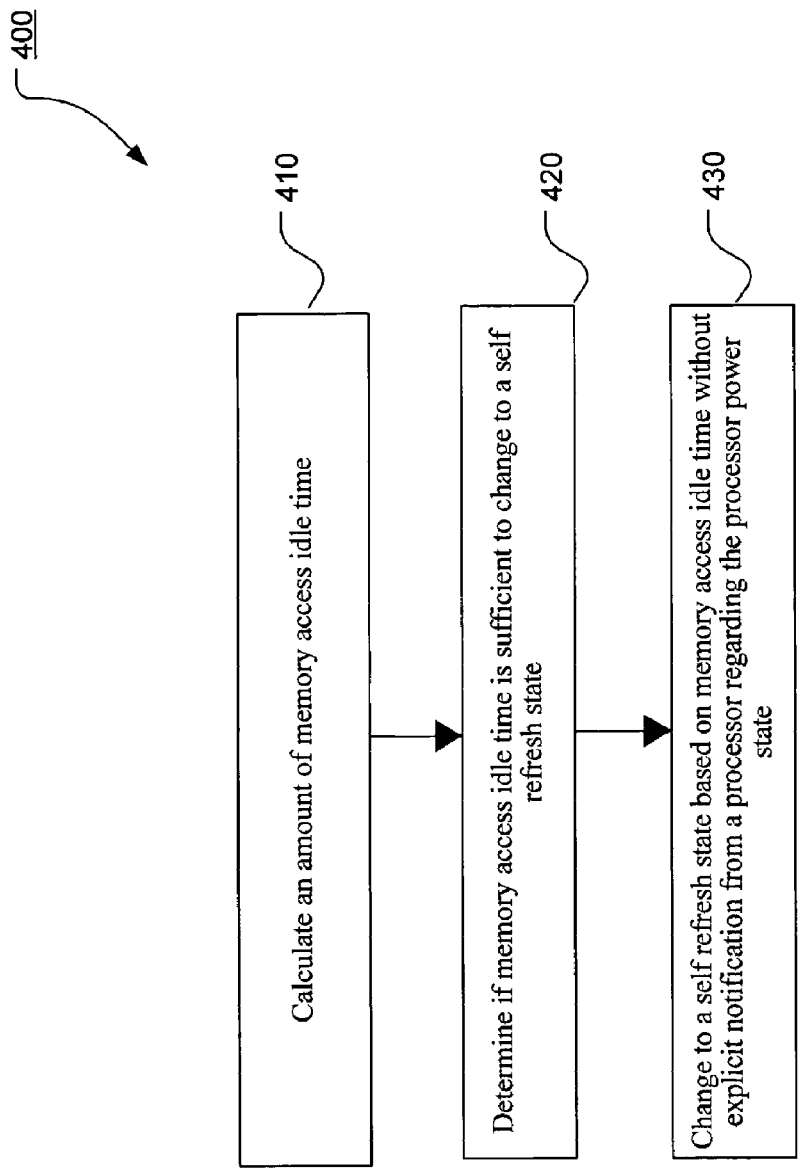
FIG. 4 is a flow diagram illustrating an example of a process used for reducing the power consumption of the memory and the graphics controller, according to one embodiment.

FIG. 4 is a flow diagram illustrating an embodiment method 400 for reducing the power consumption of a memory and/or a graphics controller. Referring to FIG. 4, an embodiment method for a memory to enter self-refresh may comprise calculating the amount of memory access idle time as shown in block 410, in block 420 the embodiment method 400 may include determining if memory access idle time is sufficient to change to a self-refresh state, and in block 430 embodiment method 400 can include changing to a self-refresh state based on memory access idle time without explicit notification from a processor regarding the processor power state.

In some embodiment methods the memory access idle time may be a duty cycle threshold during an evaluation interval.

As an example, while operating on battery power with an active processor, a mobile embodiment may detect an idle time of 20 percent and then may transition into a DRPM state, while an idle time of 40 percent results in a transition to a self-refresh state for attached memory, as discussed with reference to FIG. 3.

Additionally, in some embodiment methods the memory access idle time can be a minimum duration in a specific power state. For example, if a minimum time is reached in a controller state, for example a memory controller that has been in a DRPM state for a certain duration may promote to a self-refresh state and attached memory may go into self-refresh, or if the memory controller is under a certain threshold it may demote to a normal memory state. Some embodiments may comprise setting a control bit to optionally promote within a same idleness period.

The present invention may be embodied in other specific forms without departing from its spirit or essential characteristics. The described embodiments are to be considered in all respects only as illustrative instead of restrictive or limiting. Therefore, the scope of the invention is indicated by the appended claims rather than by the foregoing description. All changes, modifications, and alterations that come within the meaning, spirit, and range of equivalency of the claims are to be embraced as being within the scope of the appended claims.

The invention claimed is:

1. A method for memory to enter self refresh comprising:
calculating an amount of memory access idle time;
determining if memory access idle time exceeds one of an AC threshold and a DC threshold to change to a self refresh state, wherein the AC threshold corresponds to operation when AC power is provided and the DC threshold corresponds to operation when DC power is provided; and
changing to a self refresh state based on memory access idle time without explicit notification from a processor regarding the processor power state.

2. The method of claim 1, wherein the memory access idle time is a minimum duration in a specific power state.

3. The method of claim 1, further comprising demoting to a higher power state if the memory access idle time is less than a threshold.

4. The method of claim 1 wherein the memory access idle time is a duty cycle threshold during an evaluation interval.

5. The method of claim 1 wherein the memory access idle time is evaluated over a sliding window evaluation period using a finite impulse response (FIR) filter.

6. The method of claim 1 wherein the memory access idle time is evaluated over a sliding window evaluation period using an infinite impulse response (IIR) filter.

7. An apparatus comprising:
a link coupled with a memory; and
circuitry coupled with the link, the circuitry to:
 calculate an amount of memory access idle time over the link;
 determine if memory access idle time exceeds one of an AC threshold and a DC threshold to change to a self refresh state, wherein the AC threshold corresponds to operation when AC power is provided and the DC threshold corresponds to operation when DC power is provided; and
 change to a self refresh state based on memory access idle time without explicit notification from a processor regarding the processor power state.

8. The apparatus of claim 7, wherein the memory access idle time is a minimum duration in a specific power state.

9. The apparatus of claim 7, the circuitry further to demote to a higher power state if the memory access idle time is less than a threshold.

10. The apparatus of claim 7 wherein the memory access idle time is a duty cycle threshold during an evaluation interval.

11. The apparatus of claim 7 wherein the memory access idle time is evaluated over a sliding window evaluation period using a finite impulse response (FIR) filter.

12. The apparatus of claim 7 wherein the memory access idle time is evaluated over a sliding window evaluation period using an infinite impulse response (IIR) filter.

13. A system comprising:
an integrated battery power source to power circuitry;
a memory coupled with a link; and
circuitry coupled with the link, the circuitry to:
   calculate an amount of memory access idle time on the link;
   determine if memory access idle time exceeds one of an AC threshold and a DC threshold to change to a self refresh state, wherein the AC threshold corresponds to operation when AC power is provided and the DC threshold corresponds to operation when DC power is provided; and
   change to a self refresh state based on memory access idle time without explicit notification from a processor regarding the processor power state.

14. The system of claim 13, wherein the memory access idle time is a minimum duration in a specific power state.

15. The system of claim 13, where the circuitry is further to demote to a higher power.

16. The system of claim 13 wherein the memory access idle time is a duty cycle threshold during an evaluation interval.

17. The system of claim 13 wherein the memory access idle time is evaluated over a sliding window evaluation period using a finite impulse response (FIR) filter.

18. The system of claim 13 wherein the memory access idle time is evaluated over a sliding window evaluation period using an infinite impulse response (IIR) filter.

* * * * *